United States Patent
Kaja et al.

(10) Patent No.: US 6,669,833 B2
(45) Date of Patent: Dec. 30, 2003

(54) PROCESS AND APPARATUS FOR ELECTROPLATING MICROSCOPIC FEATURES UNIFORMLY ACROSS A LARGE SUBSTRATE

(75) Inventors: Suryanarayana Kaja, Hopewell Junction, NY (US); Chandrika Prasad, Wappingers Falls, NY (US); RongQing Roy Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/405,537

(22) Filed: Apr. 2, 2003

(65) Prior Publication Data

US 2003/0168340 A1 Sep. 11, 2003

Related U.S. Application Data

(63) Continuation-in-part of application No. 09/699,909, filed on Oct. 30, 2000, now abandoned.

(51) Int. Cl.⁷ .............................. C25D 5/00; C25D 21/10
(52) U.S. Cl. .................. 205/96; 204/224 R; 204/229.9; 204/DIG. 7; 205/123; 205/148
(58) Field of Search .......................... 205/96, 97, 123, 205/148, 157; 204/224 R, DIG. 7, 229.9

(56) References Cited

U.S. PATENT DOCUMENTS

| | | | | |
|---|---|---|---|---|
| 3,437,578 A | * | 4/1969 | Gibbs et al. | 204/230.7 |
| 3,652,442 A | * | 3/1972 | Powers et al. | 204/273 |
| 4,102,756 A | * | 7/1978 | Castellani et al. | 205/82 |
| 4,678,545 A | * | 7/1987 | Galik | 205/50 |
| 4,828,653 A | * | 5/1989 | Traini et al. | 205/96 |
| 5,135,636 A | * | 8/1992 | Yee et al. | 205/96 |
| 5,516,412 A | * | 5/1996 | Andricacos et al. | 204/224 R |
| 5,620,581 A | * | 4/1997 | Ang | 205/96 |
| 6,001,235 A | * | 12/1999 | Arken et al. | 205/137 |
| 6,027,631 A | * | 2/2000 | Broadbent | 205/137 |
| 6,071,388 A | * | 6/2000 | Uzoh | 204/287 |
| 6,074,544 A | * | 6/2000 | Reid et al. | 205/157 |
| 6,077,405 A | * | 6/2000 | Biggs et al. | 204/287 |
| 6,113,759 A | * | 9/2000 | Uzoh | 204/285 |
| 6,391,168 B1 | * | 5/2002 | Ueno | 204/242 |

OTHER PUBLICATIONS

Metal Finishing Guidebook and Directory for 1975, Metals and Plastics Publications, Inc., Hackensack, N.J., 1975, month of publication not available pp. 624–637.*

* cited by examiner

Primary Examiner—Roy King
Assistant Examiner—William T. Leader
(74) Attorney, Agent, or Firm—Graham S. Jones, II; Ira D. Blecker

(57) ABSTRACT

A process and apparatus are provided for electroplating a film onto a substrate having a top side including a plating surface includes the following steps. Provide a plating tank with an electroplating bath. Provide an anode in the bath. Place a substrate having a plating surface to be electroplated into the electroplating bath connecting surfaces to be plated to a first cathode. Support a second cathode including a portion thereof with openings therethrough extending across the plating surface of the substrate and positioned between the substrate and the anode. Connect power to provide a negative voltage to the first cathode and provide a negative voltage to the second cathode, and provide a positive voltage to the anode.

41 Claims, 6 Drawing Sheets

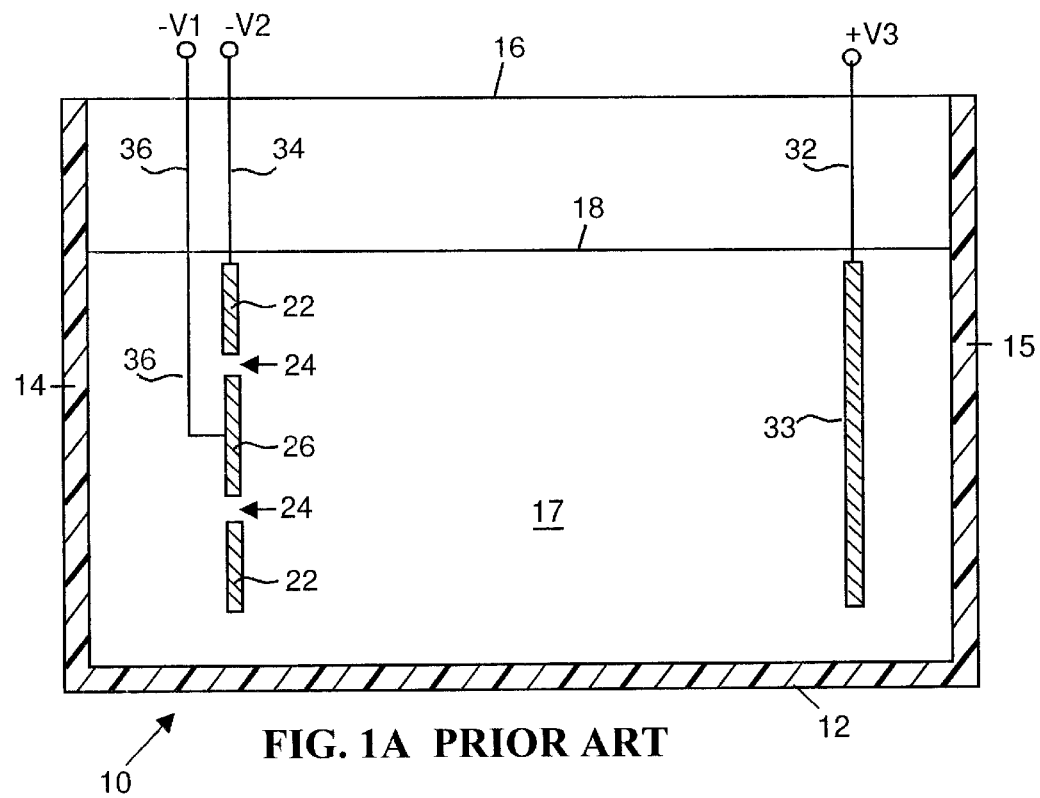
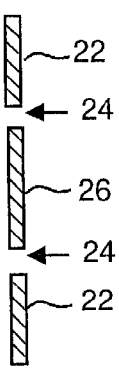
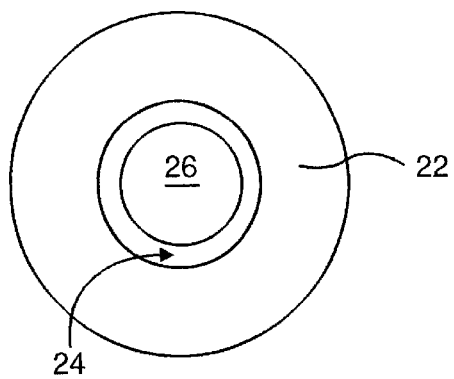
FIG. 1A PRIOR ART
FIG. 1B PRIOR ART
FIG. 1C PRIOR ART

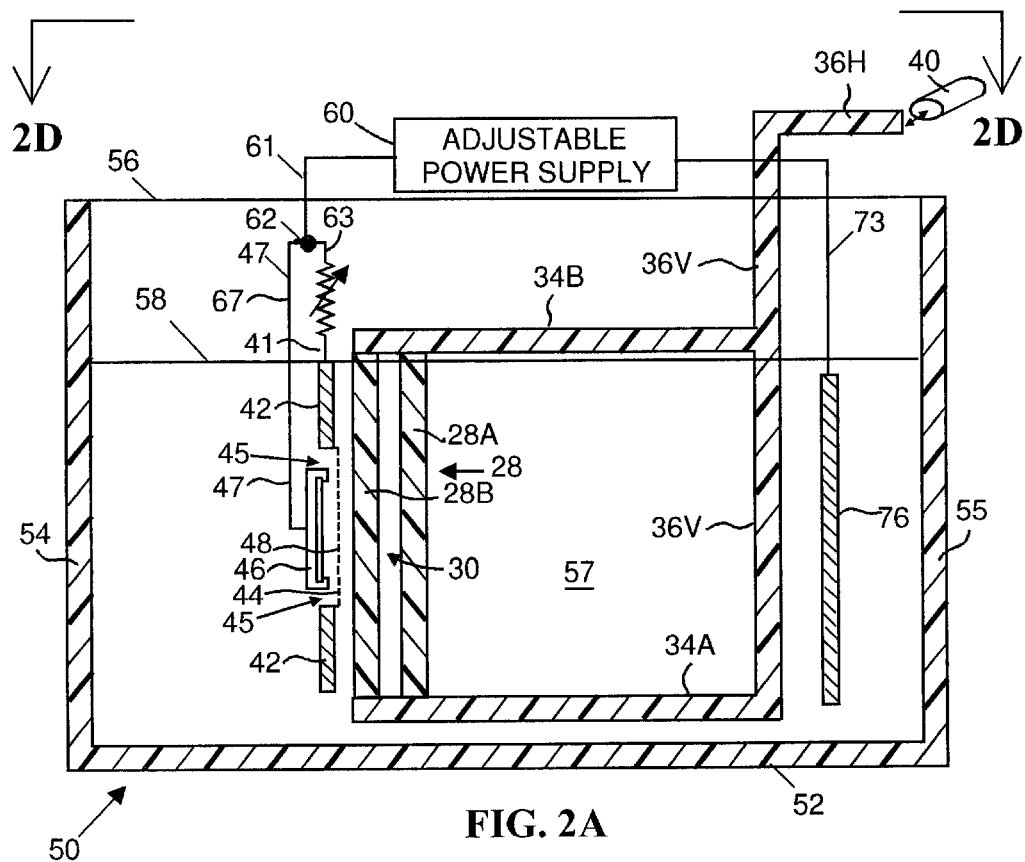
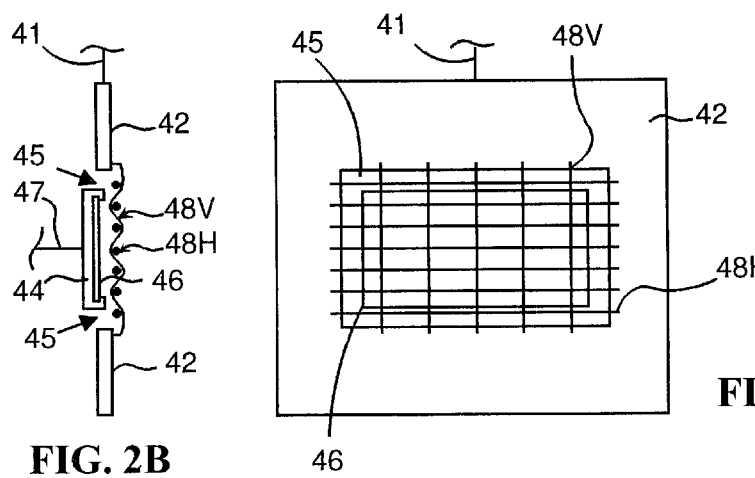
FIG. 2A
FIG. 2B
FIG. 2C

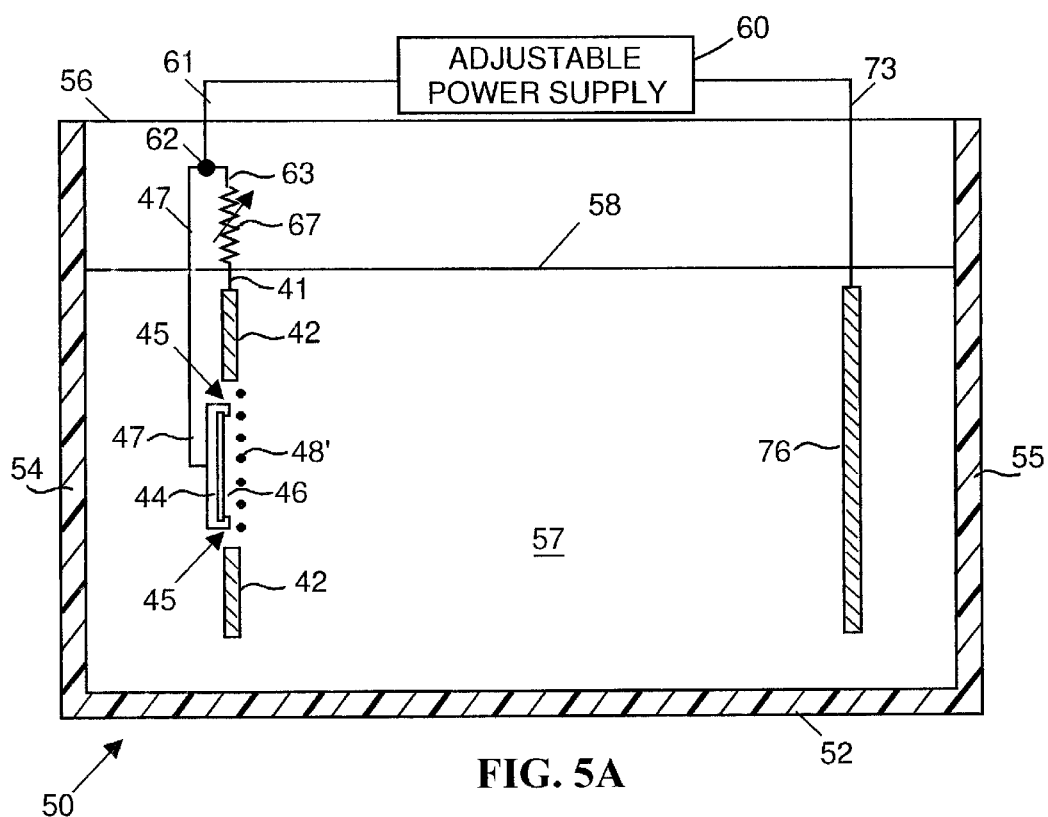
FIG. 5A
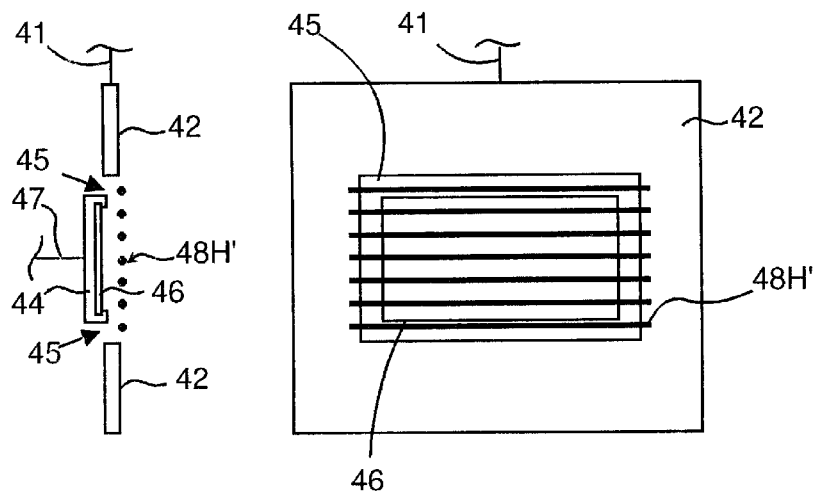
FIG. 5B    FIG. 5C

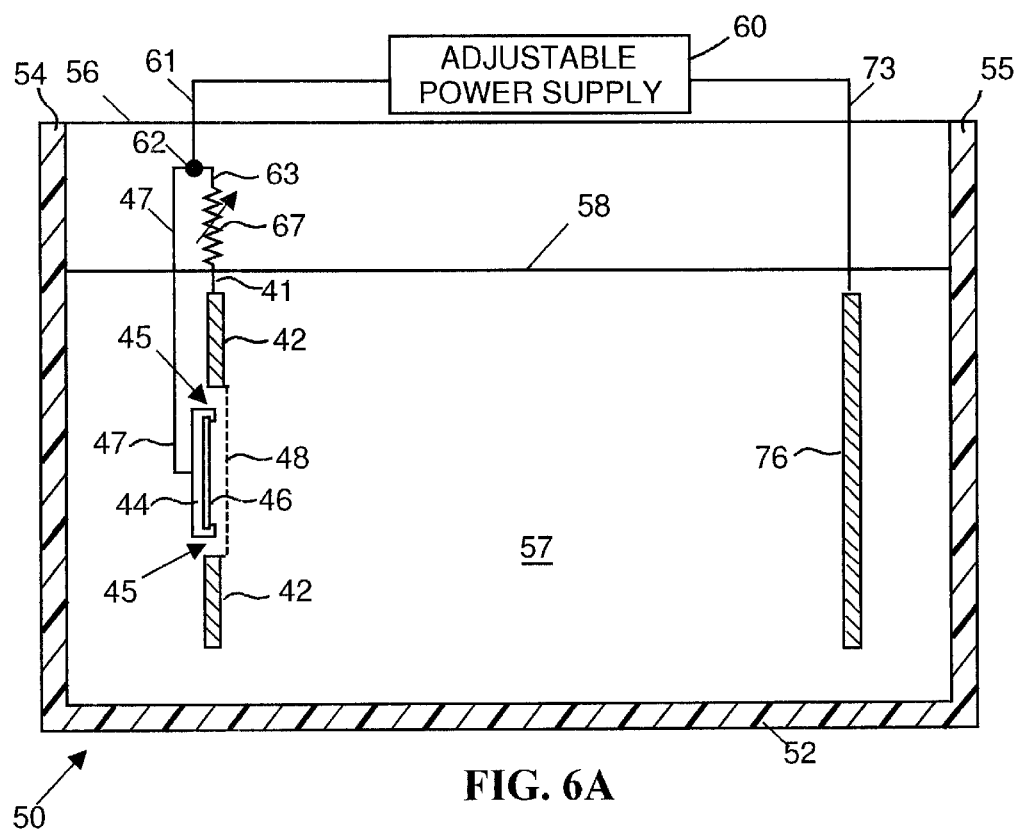
FIG. 6A
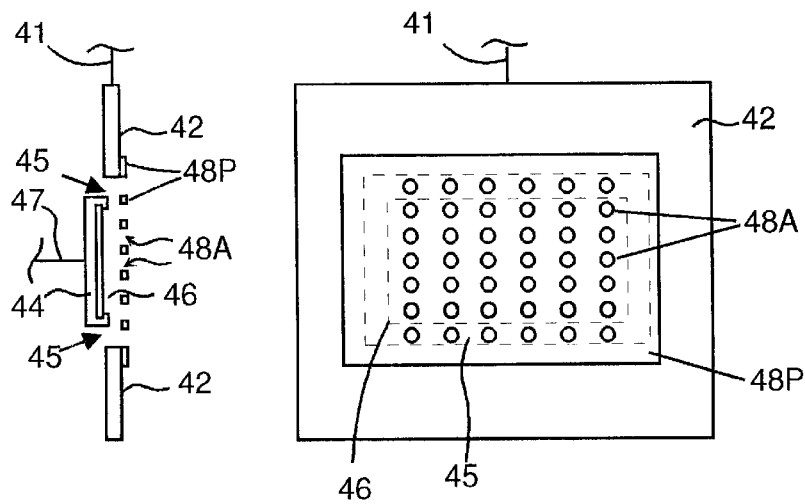
FIG. 6B     FIG. 6C

PROCESS AND APPARATUS FOR ELECTROPLATING MICROSCOPIC FEATURES UNIFORMLY ACROSS A LARGE SUBSTRATE

This application is a continuation-in-part of U.S. patent application Ser. No. 09/699,909 filed Oct. 30, 2000. now abandoned.

BACKGROUND OF THE INVENTION

1. Field of the Invention

This invention relates to processes and apparatus for plating metals onto a workpiece and more particularly to processes and apparatus for relatively uniformly, and selectively plating of small features on a workpiece.

2. Description of Related Art

A serious problem in electroplating microscopic features non-uniformly dispersed on a large substrate of a workpiece is that the total current required for depositing the material onto these microscopic features is very small. There are no commercially available power supplies that can reliably deliver the required kind of small currents to the workpiece/substrate.

FIGS. 1A–1C are schematic diagrams which illustrate a prior art type of plating system using a thief electrode ring 22 surrounding a workpiece 26 such as a silicon wafer to enhance the quality of plating of metal onto the workpiece 26 through a photoresist mask formed thereon (not shown) as is widely practiced in the art. In FIG. 1A which is a vertical elevational view, a plating tank 10 has a bottom 12, left sidewall 14 and right sidewall 15 and a top 16 shown to be open. FIG. 1B shows the thief ring 22 and the substrate 26 isolated from the other elements seen in FIG. 1A. FIG. 1C is a right side view of what is shown in FIG. 1B. In the example shown here, the tank 10, which is formed of a dielectric material, contains an electroplating bath 17 up to the level shown by line 18. An anode 33 is located in the plating tank 10 near the right sidewall 15. A positive voltage V3 is applied to anode 33 by a connection wire 32. The workpiece 26, which is shown on the side of the tank 10 near the left sidewall 14 has a negative voltage (−V1) applied thereto by a connection wire 36. There is a thief ring 22, which surrounds the workpiece 26 is coplanar with the workpiece 26. A second negative voltage (−V2) is applied to the thief ring 22 by a connection wire 34. A space 24 is provided between the workpiece 26 and the thief ring 22. The thief ring is adjusted in voltage to adjust the plating current to the workpiece 26, but it is not possible to maintain an equal current density across the large surface of the substrate 26 which may be several inches wide.

As a result, the thickness of the material deposited on various features on the workpiece 26 can vary from workpiece to workpiece. This variation creates a very big quality control problem for the plating engineer who is required to deposit a desired thickness on all of the features of the workpieces 26 within narrow tolerances.

A second and more important problem in dealing with small features dispersed on a large substrate 26 is that the secondary current, and higher order currents, cause tremendous non-uniformity in the thickness of the deposited material from place to place across the workpiece 26. This non-uniformity will vary depending upon the density of the features and also on the size of the features on the substrate 26.

Prior art relating to cathodes in electroplating baths include the following patents.

U.S. Pat. No. 3,652,442 of Powers et al. for "Electroplating Cell Including Means to. Agitate Electrolyte in a Laminar Flow" describes a Horizontal Paddle Electroplating Cell (HPEC) in which a cathode in the form of an insulating board to which is affixed a conductive sheet or coating with a very smooth upper surface. The cathode is shown with its flat upper surface extending horizontally at the bottom of the cell lying on a conductive support block. The bath is agitated during plating by a base portion which moves continuously at a substantially uniform rate in a path back and forth along the length of the cathode and just above the surface thereof. The result is that the bath solution is homogenized on the surface of the cathode. Agitating means is provided including a motor connected by linkages to the base portion which causes a uniform laminar flow of the bath across the surface of the cathode without causing any measurable turbulence on the surface thereof. The agitating base, which is designed to cause minimal resistance to flow of the bath, is triangular in cross section with a blunted apex at an angle which permits flow thereover with minimal turbulence, while at its base which confronts the cathode the agitating base is flat so that the agitating caused by the agitating base caused the bath to flow over the base and to effect mixing with the bulk of the bath at the apex of the base by convection. As the mixture passes the apex, the laminar flow is restored. The system is used to plate magnetic metal alloys.

In U.S. Pat. No. 4,102,756 of Castellani et al. entitled "Nickel-Iron (80:20) Alloy Thin Film Electroplating Method and Electrochemical Treatment and Plating Apparatus", which describes another HPEC for plating films to form batch-fabricated, magnetic bubble devices and magnetic recording thin film heads, in which the plating bath is maintained at a level at which the anode is immersed in the bath during electroplating of a magnetic recording device. The constituents of the bath are constantly replenished and bath temperature is controlled by recirculation from a reservoir where it is refreshed by dispensing acid, iron and preferably also Na, Saccharin, Na lauryl sulfate and/or $Ni^{++}$ if needed and constantly stirred by a horizontal reciprocating mixer otherwise referred to herein as a paddle, which travels back and forth horizontally above the surface of the cathode at an approximate distance of $\frac{1}{32}$ to $\frac{1}{8}$ inch (79 mm to 318 mm) for providing agitation of the bath with minimal turbulence.

U.S. Pat. No. 5,516,412 of Andricacos et al. describes a "Vertical Paddle Plating Cell" (VPPC) which is a modification of the Castellani et al cell adapted for microplating metal onto a substrate an article which is a flat, circular wafer or substrate having a substantial number of individual IC chip patterns arranged suitably thereon. The microplating process may comprise electroplating or electroless plating process. As microplating techniques were being developed for manufacturing devices such as features with a trend to continuously smaller and smaller dimensions of integrated circuits (ICs) in the form of microscopic chips formed on a flat circular wafer or substrate, it became necessary to reorient the plating system to suspend the article being plated vertically to remove debris from the surface being plated. Furthermore, as metal ions are depleted from the electrolyte, the uniformity of the electrolyte is decreased and must be suitably corrected to avoid degradation of the electroplating process so use of the laminar flow type of paddles was required to assure uniformity of the composition of the plating bath at the microsufaces being microplated. Because of the very small areas being plated in the microplating process of forming microcircuits on IC devices, a thief electrode was added behind the article being plated extending beyond the periphery thereof to enhance performance. Moreover the clearance between the surface of the article (substrate) being plated and the laminar paddle was decreased by one or more orders of magnitude to 1 mm to 4 mm from the 79 mm to 318 mm of the above HPEC plating apparatus of Castellani et al., U.S. Pat. No. 4,102, 756. Thus the plating cell was adapted for electroplating the exposed surface of an article that is supported vertically on a vertical rack. The rack includes a thief electrode laterally surrounding the article to define a cathode. The cell includes a reciprocating vertical paddle (of the kind described in the above Powers et al. patent) which includes two elongated, parallel prisms which have oppositely facing, parallel, flat bases with one of the bases being disposed parallel to and closely adjacent to the article or rack for parallel movement over the article supported therein, preferably skimming across the surface of the article being plated, about 4.0 mm therefrom. Since the surface of the article to be microplated is preferably disposed vertically, and relative to gravity, the VPPC includes an elongated paddle which is disposed vertically lengthwise in the plating cell adjacent to the article being plated and rack. Means are provided for reciprocating the paddle between the front and back walls of the plating cell for suitably agitating the electrolyte inside the cell to diminish adverse plating effects from buoyancy or gravity induced convection within the plating cell. The reciprocating paddle is in the exemplary form of a pair of vertically elongated, triangular (45°–90°–45°) prisms having spaced apart, parallel apexes defining a throat therebetween through which the electrolyte flows. Suitable means are provided for bathing or filling a cell and an outer cell with electrolyte to the desired elevation above the inner cell for providing overflow discharge from an outlet weir to continuously recirculate the electrolyte through the inner cell, as well as through the outer cell. A suitable external reservoir is provided suitably remote from the VPPC for storing as well as providing a suitable source of the electrolyte. One or more suitable flow conduits join the outlet trough, the reservoir, and the inner cell in a closed-loop fluid circuit for recirculating the electrolyte. A suitable pump is disposed in the flow conduit between the inner cell and the reservoir for continuously recirculating the electrolyte in the fluid circuit. A suitable filter is also disposed in the flow conduit between the pump and the inner cell for filtering the electrolyte prior to return thereof to the inner cell. Suitable temperature control of the electrolyte is typically also provided for providing suitably clean electrolyte at the preferred temperature in a conventional manner.

Currently, where the article to be plated is a semiconductor wafer upon which microcircuits are being formed, non-uniformity of microplating is a problem caused by the very low density of the area of the metallic surfaces as a percentage of the pattern design. In addition, the clearance between the wafer and the reciprocating paddle in such a system is in the order of 1–5 mm. When the metallic areas of the wafer design feature density are very low (<1%) or very patchy (localized here and there) the thief used in the prior art can no longer function properly. The problem being encountered is that substantially all of the plating current is drawn to the thief due to its dominant size because the density of the plating surface of the thief approaches 100% vs. the density of plating surface in the wafer which may be as low as 1% or less. Thus there is a need for a solution to the problem of non-uniformity of plating to achieve proper functioning of the plating system by assuring that enough of the ions approaching the cathode are directed towards the article to be microplated.

U.S. Pat. No. 6,027,631 of Broadbent for "Electroplating System with Shields or Varying Thickness Profile of Deposited Layer", which is concerned with plating a blanket layer across a substrate, describes an electroplating system where a shield is placed above and adjacent to a workpiece; and the workpiece is rotated, so as to form uniform plating across the workpiece. The process described employs physical obstruction of current by use of the shield(s). However, the shield(s) is electrically inactive and is inserted between cathode (part or substrate) and the anode. The shield is placed in location and the substrate is rotated with respect to the shield. Thus the substrate or wafer is exposed to the anode part of the time. It is believed by the inventors that this method is applicable to plating larger features in inert matrix photoresist mask, but not to plating of small features distributed in a non-uniform distribution across the entire substrate. Also this method does not help when the active area that needs to be plated is small since the shield is not electrically connected to the substrate to increase the 'apparent size' of the workpiece or substrate.

U.S. Pat. No. 6,077,405 of Biggs et al., commonly assigned, for "Method and Apparatus for Making Electrical Contact to a Substrate During Electroplating" also shows a peripheral ring electrode, often referred to as a "thief ring" since it is an auxiliary cathode which diverts cathode current away from the primary cathode. The Biggs et al. patent describes the structure of exemplary substrates and mechanical and electrical connections to the substrates.

U.S. Pat. No. 5,135,636 of Yee et al. for "Electroplating Method" describes a plating rack for use in electroplating at least one substrate comprising a silicon wafer surrounded by a metal ring with cam assemblies holding the wafer in place and for making electrical contact between the ring and the wafer and passing a current from the ring to the wafer while they are submerged in an electroplating bath.

U.S. Pat. No. 5,620,581 of Ang for "Apparatus for Electroplating Metal Films Including a Cathode Ring, Insulator Ring, and Thief Ring" describes apparatus for electroplating metal films composed of dual metal, i.e. a PERMALLOY™ type of (NiFe) alloy, where a wafer workpiece is set inside a thief ring and coplanar to the ring. The part is connected to a first power supply. The power to the thief ring is described by text which is at variance with the drawings which show a second connection line to a common connection to a D.C. voltage source which is referred to as a "dual channel power supply . . . employed to generate separately controlled current densities to the thief ring . . . and the cathode ring . . . " which is used so that by controlling "the thief current density, the metal composition of the electroplated metal film is controlled." There is also a stainless steel "cathode ring" which mechanically supports the lower surface of the substrate/wafer which electrically connects the wafer to a power supply. The objectives of Ang include a compositional uniformity as well as thickness uniformity. Essentially, the Ang patent addresses edge effects and the primary current distribution problem.

U.S. Pat. No. 6,001,235 of Arken et al., commonly assigned, for "Rotary Plater with Radially Distribute Plating Solution" shows a rotating cathode and a rotating segmented ring formed of a set of separated annular thief elements.

U.S. Pat. No. 6,071,388 of Uzoh for "Electroplating Workpiece Fixture Having Liquid Gap Spacer" shows a peripheral thief ring electrode. Uzoh suggests that the thief ring electrode should comprise of a stainless steel or titanium plate including a metal mesh or screen such as No. 4 or No. 30 metal mesh corresponding to wires per inch. The mesh increases the surface area of the thief ring electrode, but does not solve the problem of non-uniformity of plating of small features.

U.S. Pat. No. 6,074,544 of Reid et al. for "Method for Electroplating Semiconductor Wafer Using Variable Currents and Mass Transfer to Obtain Uniform Plated Layer" describes forming a metal seed layer and providing electrical contacts at the edge of a wafer which leads to the dish-effect in which the thickness of the layer is less in the center. Reid teaches minimization of the dishing effect by using a low plating current density initially to reduce the resistive (IR) voltage drop followed by increasing the current density to a higher level after reaching a predetermined thickness and resistivity.

U.S. Pat. No. 4,828,653 of Traini et al. for "Long Lasting Anode for High Current Density Galvanization" relates to anodes in electroplating baths includes the following patent, which is not analogous to this invention since it pertains to cathodes in electroplating baths includes the following patent but does show to employment of a mesh in a plating bath electrode well over a decade ago. Traini et al. describes a long lasting anode formed by several parallel layers of foraminous (i.e. having small openings or perforations) sheets of metallic mesh with different patterns. The sheets of metallic mesh are resistant to the electrolyte such as Ti, Ta, NB or W in electrical contact with each other. The metals used in the mesh are preferably inert to a plating liquid in a electroplating bath presumably to prevent dissolution of the metals in the mesh into the plating solution during plating of the cathode.

The current electroplating process used in some thin film applications such as semiconductor packaging uses a fixture that holds a workpiece/substrate and an auxiliary electrode also widely known as a thief plate. The auxiliary (thief) electrode surrounds the actual workpiece in such a way that the substrate surface and the auxiliary electrode surface are in a plane. The main workpiece and the auxiliary electrode can be connected to two different power supplies so that the voltages/currents can be controlled independently. This arrangement works fairly well when the active area being plated is relatively large and uniformly distributed across the entire substrate. However, problems occur with the peripheral thief ring process when the active area on the substrate is microscopic and/or when the area is non-uniformly distributed over the substrate surface.

SUMMARY OF THE INVENTION

There are problems with electroplating microscopic features which are often out of the primary current distribution region. There is a lack of sufficient thieving activity to provide the desired secondary current distribution and higher order current distribution in the plating bath which will permit uniform plating. Moreover there is a lack of commercial power supplies that can reliably deliver small currents to electroplate small areas. In addition there has been an inability to provide methods and means for electroplating myriad microscopic features with unknown active areas. In the ever increasing trend towards smaller and smaller microscopic electronic devices it is not possible to provide apparatus and methods which can be tailored to each permutation of distribution of microscopic features on a workpiece.

In addition there is a limitation of substrate size that can be used with traditional peripheral thieving rings surrounding the workpiece.

It is an object of this invention to electroplate microscopic features that are non-uniformly dispersed on a large substrate.

An object of this invention is an electroplating process including plating fixture for electroplating very microscopic features dispersed on a large substrate with a high degree of uniformity.

A process in accordance with this invention is provided for electroplating a film onto a substrate having a top side including a plating surface includes the following steps. Provide a plating tank with an electroplating bath. Provide an anode in the bath. Place a substrate having a surface to be electroplated into the electroplating bath connecting surfaces to be plated to a first cathode. Support a second cathode including a portion thereof with openings therethrough extending across the plating surface of the substrate and positioned between the substrate and the anode. Connect power to provide a negative voltage to the first cathode and provide a negative voltage to the second cathode, and provide a positive voltage to the anode.

Preferably, the openings comprise apertures through the second cathode extending across the substrate the openings are formed between parallel wires extending across the substrate, or the openings comprise a wire mesh extending across the substrate, or the openings comprise apertures formed in a plate which is preferably a stainless steel plate located between the anode and the cathode.

Preferably, the first cathode and the second cathode are connected to an adjustable power supply.

Preferably, the first cathode and the second cathode are connected to the same power supply.

Preferably, the first cathode and the second cathode are connected to the same power supply with a resistor in series with the second cathode.

In accordance with another aspect of this invention, a process for electroplating a film onto a substrate having a top side including a plating surface comprises the following steps. Provide a plating tank with an electroplating bath. Provide an anode in the bath. Place a substrate to be electroplated into the electroplating bath connecting surfaces to be plated to a first cathode. Support a second cathode including a partially open screening electrode selected from a plating mesh and aperture plate and parallel wires proximate to the substrate between the substrate and the anode. Connect a power supply by providing a negative voltage to the first cathode and to the screening electrode and providing a positive voltage to the anode.

The openings comprise a wire mesh extending across the substrate and the first, cathode and the second cathode are connected to power supplied in a manner selected from the group consisting of a power supply with a resistor in series with the second cathode, the first cathode and the second cathode are connected to the same power supply, the first cathode and the second cathode are connected to same power supply with a resistor in series with the second cathode, and the first cathode and the second cathode are connected to an adjustable power supply process in accordance with this invention is provided for electroplating a film onto a substrate having a top side including a plating surface includes the following steps. Provide a plating tank with an electroplating bath. Provide an anode in the bath. Place a substrate having a plating surface to be electroplated into the electroplating bath connecting surfaces to be plated to a first cathode. Support a second cathode including a portion thereof with openings therethrough extending across the plating surface of the substrate and positioned between the substrate and the anode. Connecting power to provide a negative voltage to the first cathode and provide a negative voltage to the second cathode, and provide a positive voltage to the anode.

Apparatus in accordance with this invention is provided for electroplating a film onto a substrate having a top side including a plating surface includes the following steps. The apparatus includes a plating tank with an electroplating bath, an anode in the bath. A substrate having a plating surface to be electroplated is placed in the electroplating bath with surfaces to be plated connected to a first cathode. A second cathode including a portion thereof with openings therethrough is supported extending across the plating surface of the substrate and positioned between the substrate and the anode. Power to provide a negative voltage is connected to the first cathode and provide a negative voltage to the second cathode, and provide a positive voltage to the anode.

Preferably, the openings comprise apertures through the second cathode extending across the substrate the openings are formed between parallel wires extending across the substrate, or the openings comprise a wire mesh extending across the substrate, or the openings comprise apertures formed in a plate which is preferably a stainless steel plate located between the anode and the cathode.

Preferably, the first cathode and the second cathode are connected to an adjustable power supply, the first cathode and the second cathode are connected to the same power supply, and the first cathode and the second cathode are connected to the same power supply with a resistor in series with the second cathode.

In accordance with another aspect of this invention, means are provided for electroplating a film onto a substrate having a top side including a plating surface comprises the following steps including a plating tank with an electroplating bath and an anode in the bath. The substrate to be electroplated is placed into the electroplating bath connecting surfaces to be plated to a first cathode. A second cathode is supported in the bath. The second cathode includes a partially open screening electrode selected from a plating mesh and aperture plate and parallel wires proximate to the substrate between the substrate and the anode. A power supply is connected by providing a negative voltage to the first cathode and to the screening electrode and providing a positive voltage to the anode.

The openings comprise a wire mesh extending across the substrate and the first cathode and the second cathode are connected to power supplied in a manner selected from the group consisting of a power supply with a resistor in series with the second cathode, the first cathode and the second cathode are connected to the same power supply, the first cathode and the second cathode are connected to same power supply with a resistor in means for providing, and the first cathode and the second cathode are connected to an adjustable power supply.

BRIEF DESCRIPTION OF THE DRAWINGS

The foregoing and other aspects and advantages of this invention are explained and described below with reference to the accompanying drawings, in which:

FIGS. 1A–1C are schematic diagrams which illustrate a prior art type of plating system using a thief electrode ring surrounding a workpiece such as a silicon wafer of enhance the quality of plating of metal onto the workpiece through a photoresist mask formed thereon.

FIGS. 2A–2E are schematic diagrams which illustrate an electroplating system including a plating tank, a bath, an anode and a second cathode (thief electrode/mesh) for plating a workpiece that is removably affixed to a cathode fixture in accordance with this invention.

FIGS. 5A–5C show a modification of the embodiment of FIG. 2A wherein the mesh has been replaced by a parallel array of wires which disperse the current to a substantial degree providing easy circulation of ions to all portions of the substrate.

FIGS. 6A–6C show a modification of the embodiment of FIG. 2A wherein the mesh has been replaced by a stainless steel plate which has through holes machined therethrough in the form of a matrix

DESCRIPTION OF THE PREFERRED EMBODIMENT

Figure 2D:
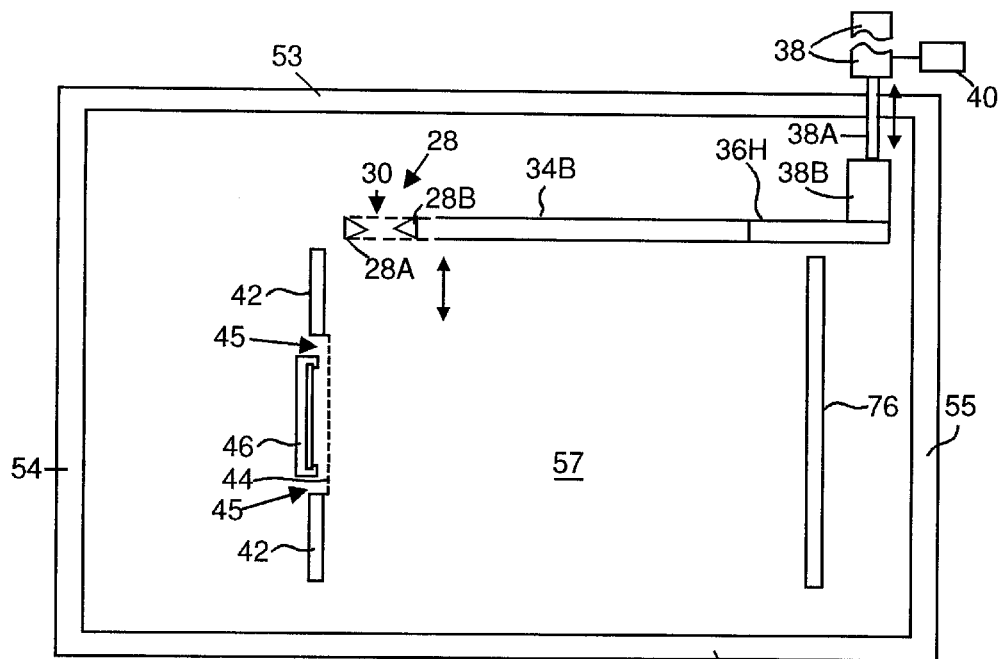
Figure 2E:
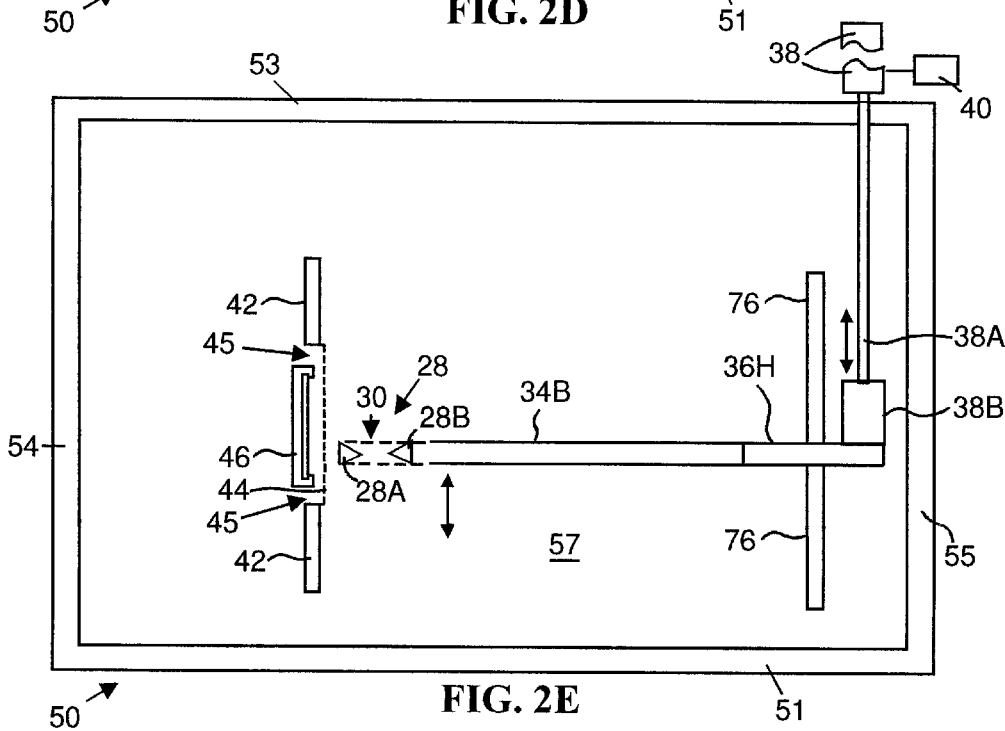

FIGS. 2A–2C are schematic diagrams which illustrate a VPPC electroplating system including a plating tank 50, a bath 57, an anode 76 and a second cathode (thief electrode/mesh) 42/48 for microplating selected portions of a workpiece 46 that is removably affixed to a cathode fixture 44 in accordance with this invention. The plating solution is stirred by agitation means which mixes the solution with a reciprocating paddle 28 comprising a pair of parallel blades 28A/28B defining a throat 30 therebetween. The blades 28A/28B comprise vertically elongated, triangular (45°–90°–45°) prisms which have spaced apart, parallel apexes separated by the narrow, vertically extending throat 30 through which the electrolyte of the bath 57 flows. As the paddle 28 moves, the blade 28B skims across the surface of the wafer 46, the thief 42 and the mesh 48. The reciprocating paddle 28, which slips through the solution producing a laminar flow instead of turbulence, extends vertically in the plating tank 50 Arms 34A and 34B (extending horizontally from the left to the right on the page) reciprocate the blades 28A/28B across the mesh 48 so that the blades 28A/28B and the arms 34A/34B move horizontally into and out of the page generally in accordance with U.S. Pat. No. 5,516,412 of Andricacos et al. The teachings of Andricacos et al. are incorporated herein by reference including the laminar flow provided by the paddle above and the recirculation of fluid in inner and outer chambers. The reciprocating paddle 28 is in the form of a pair of vertically elongated, triangular (45°–90°–45°) prisms. However the schematic diagram shown in FIGS. 2A, 2D and 2E are simplified to focus upon the salient features of the apparatus and method of this invention. FIGS. 2D and 2E are schematic, plan views of the device of FIG. 2A taken along line 2D—2D in FIG. 2A which show the blades 28A and 28B of the paddle 28 and arm 34B (as well as the mechanical transfer mechanism described below) in two positions as they continuously reciprocate from the back to the front of the tank 50 with the blades 28A/28B being scanned across the thief 42/48 and the wafer 46 by arms 34A/34B.

Referring to FIG. 2A, the microplating process of this invention overcomes the above-mentioned limitations by employing a second cathode 42/48 comprising the combination of a wire mesh 48 and a peripheral, shadow workpiece (thief) electrode 42 which supports the wire mesh 48 of woven wires which are juxtaposed with the wafer 46 (also referred to hereinbelow as a semiconductor wafer 46 or wafer 46). The wire mesh 48 of the second cathode, which is located in close proximity to all of the features on the wafer 46, does not touch the wafer 46. The wire mesh 48 provides a screen between the workpiece 46 and the metal cations which are moving from the direction of the anode 76 towards the workpiece 46 where they are to be plated. In accordance with this invention, proximity mesh plating is provided with the wire mesh 48 attached to the second cathode 42 (also referred to as thief electrode 42 hereinbelow) with the mesh placed in front of the wafer 46. The wire mesh 48 must,spaced away from the wafer 46 by between about I mm and about 4mm, as there is less than only 5 mm of space between wafer 46 and the path of blade 28B of the paddle 28 as the reciprocating paddle 28 traverses across the wire mesh 48 into and out of the page in the plating tank 50. The paddle 28 is spaced less than 5 mm from the wafer 46. Note that the wire mesh 48 of the thief 42, i.e. the second cathode, is located in front of the wafer 46. The wafer 46 on the one hand and the thief 42 (as well as wire mesh 48) on the other hand can be biased at different voltages, as shown in FIG. 2A. But it is preferred to operate with direct contact (no difference in bias therebetween). In that fashion, the thief 42 and the wafer 46 become one electrically. Since the features of the wafer 46 have a low density of plating surfaces which become part of the thief 42 electrically, the plating uniformity is now controlled by the thief 42 plus the mesh 48 and the anode 76. Preferably, the thief 42 plus the mesh 48 and the anode 76 are in perfect parallel alignment and accordingly they provide good plating uniformity. Since the wafer 46 is electrically an integral part of the thief there is uniform plating on the wafer regardless of its very low density of plating surfaces. Without the mesh, the thief 42 would appear to have a missing center as almost no current passes through the wafer 46 due to very low density of plating surfaces; so in that case the plating uniformity could not be controlled adequately. The key to the proximity mesh plating of this invention is to use the mesh 48 to make up the area deficit due to the low plating density in the wafer 46 and to attach the wafer 46 to the thief 42 and to integrate the wafer 46 with the thief 42 electrically. In this fashion, the uniformity of plating of the thief electrode 42 is transferred to the wafer 46. The mesh 48, which is typically composed of stainless steel or titanium (Ti), has a wiring size of with 0.5 mm wiring in 2–5 mm grid spacing. This is to allow maximum flow while maintaining a sufficiently smooth electric field. The function of the VPPC paddle cell must be maintained. The wire mesh 48 (screen) maintains the second cathode voltage at a substantially uniform value across the workpiece 46, thereby dominating the electropotential in the bath 57 across the total surface area of a first cathode 46 comprising a wafer (workpiece) 46 being plated. Wire mesh 48 which is bonded or tied to an auxiliary electrode 42 has many electrically conductive wires which are located in close proximity to all of the features on the wafer 46, less than 5 mm from the wafer 46. That makes it possible to control the current and the concentration of the cations delivered to all of the various locations and microscopic features on the wafer 46. The clearance between the wafer 46 and the vertical paddle 28 in this system is from about 1 mm to about 5 mm and the wire mesh 48 is located between the path of the vertical paddle 28 and wafer 46. A bottom arm 34A is fixedly joined to the bottoms of the prisms 28A/28B of the paddle 28 and a top arm 34A is fixedly joined to the tops of the prisms 28A/28B of the paddle 28. The top arm 34B and the bottom arm 34A extend horizontally and are fixedly joined to vertical bar 36V which reaches up to join crossbar 36H which is fixedly joined thereto. Referring to FIGS. 2A, 2D and 2E, a linear motor 38, which is operatively joined to the crossbar 36H, is effective for translating the crossbar 36H, vertical bar 36V and arms 34A/34B back-and-forth from the front to the back of the tank 50 correspondingly reciprocating the paddle 28 inside the tank 50. The linear motor 38, which is located near the right rear above the top of the tank 50 near the back wall 53 actuates driver 38A to drive the output block 38B from near the back wall 53 of the tank 50 towards the front wall 51 of the tank 50. A computer controller 40 controls actuator 38. Actuator driver 38A pushes and pulls the actuator output block 38B to reciprocate the crossbar 36H and the linkage described above to translate the paddle 28 from near the back wall 53 of tank 50 towards the front wall 51 of tank 50 with a predetermined velocity profile as the paddle 28 travels over the wafer 46 and thief 42. In the preferred embodiment, the velocity profile of paddle 28 is trapezoidal with a rapid linear acceleration at one of the walls 51/53, a constant velocity between the walls 51/53 and a rapid linear deceleration at the other of the walls 51/53. The frequency of reciprocation of the paddle 28 is within an exemplary range of from about 0.5 Hz to about 2.0 Hz, with 0.88 Hz –1.0 1 Hz being preferred. Accordingly acceleration and deceleration of the paddle 28 preferably occurs closely adjacent to each of the walls 51/53, within about 25 millimeters thereof, for example with constant velocity of the paddle 28 occurring over the entire extent of the wafer 46 as well as for a suitable distance adjacent thereto.

The workpiece 46 may be a semiconductor wafer, a ceramic substrate of the kind employed for packaging semiconductor chips or a plastic material suitable for use with printed circuits. The important characteristic of the workpiece 46 is that it must have one or many elements which can be electroplated.

Electrical contact to the features to be plated may be from the back of the workpiece 46. In that case, the workpiece 46 may have conductors which extend between the front and the back surfaces of the workpiece 46 such as through holes, vias or studs which can be used to connect a voltage from the front to the back of the workpiece 46.

Alternatively, the workpiece 46 can be coated with a seed layer by vacuum techniques such as PVD, sputtering or chemical deposition techniques, such as electroless plating or an electroplating method. Then a mask such as a photoresist mask can be applied to provide a pattern for electroplating of metal onto the seed layer through the holes in mask. After plating the seed layer can be etched away from the surface of the workpiece as will be well understood by those skilled in the art.

Referring again to FIGS. 2A–2C, they illustrate a type of plating system using a thief electrode 42 (shown in this particular embodiment as having a rectangular shape) surrounding a rectangular workpiece 46 to enhance the quality of plating of metal onto the workpiece 46 such as a semiconductor wafer, a ceramic package, an organic plastic package or a printed circuit board, through a photoresist mask formed thereon (not shown) as is widely practiced in the art. Obviously a semiconductor wafer would be circular in shape but the same general features would be employed.

In FIG. 2A which is a vertical elevational view, the plating tank 50 has a bottom 52, a left sidewall 54 and right sidewall 55, as well as the conventional front and back surface (not shown) which complete the plating tank 50 which is open at the top 56 in the embodiment shown in FIG. 2A. FIG. 2B shows the thief electrode 42 and the cathode-fixture 44 combined with the workpiece 46 and the thief 42 with lead lines 47/41 isolated from the other elements seen in FIG. 2A. FIG. 2C is a right side view of what is shown in FIG. 2B.

The plating tank 50 can be composed of polypropylene or stainless steel coated with an insulating coating if the tank 50 is not connected to the same potential as the ground electrode of the system.

In the example shown here, the plating tank 50, which is formed of a dielectric material, contains an electroplating bath 57 up to the level shown by line 58. The plating anode 76 is shown located in the plating tank 50 near the right sidewall 55 of the tank 50 which is a wide tank. A positive voltage is applied from an adjustable power supply 60 to the anode 76 by connection through a wire 73. The wafer 46 comprising the first cathode is shown on the left side of the plating tank 50 near the left sidewall 54 across most of the width of the tank 50 between left wall 54 and right wall 55 so that the first cathode 46 is widely spaced from the anode 76. The wafer 46 (first cathode) has a negative voltage applied thereto by connection wires 61, node 62 and 47 from the negative output from the adjustable power supply 60. The thief electrode 42, which surrounds the wafer 46 and which is substantially coplanar with the wafer 46, is rectangular as shown in FIG. 2C with an inner rectangular opening 45 therethrough withing which the cathode fixture 44 which holds the wafer 46 is nested, i.e. the fixture 44 and the wafer 46 fit within the opening 45 in thief electrode 42 with a margin provided between the inner edges of the thief electrode 42 and the outer edges of the cathode fixture 44 and wafer 46. A more negative voltage is applied to the thief electrode 42 by connection through wire 61, node 62 and a variable resistor 67 which provides an IR drop as a function of current to the thief electrode 42. A narrow space 45 is provided between the wafer 46 and the thief electrode 42 so that the wires of the wire mesh 48 are located in close proximity to all of the features on the wafer 46, between about 1 mm and about 4 mm from the wafer 46. The thief electrode 42 is adjusted in voltage to adjust the plating current to the wafer 46, but it is not possible to maintain an equal current density across the large surface of the wafer 46 which may be several inches wide.

The resistor 67 can have a resistance value from 0 ohms to a value selected as a function of the plating conditions required selected by the application on the basis of empirical data. For PERMALLOY™ type of (NiFe) alloy or plural metals use of the resistor 67 is necessary but it is possible that it is not necessary in the case of plating of nickel, gold and copper as a function of empirical data. For nickel, gold and copper, plating can be performed with the low and high current values as follows:

| Metal | Low Current (ma/cm$^2$) | High Current (ma/cm$^2$) |
|---|---|---|
| Nickel | 5.0 | 30.0 |
| Gold | 0.5 | 5.0 |
| Copper | 5.0 | 30.0 |

Our invention employs a second cathode 42/48 formed by the thief plate 42 and the metallic mesh 48 which is placed between the anode 33 and the wafer (first cathode) 46 so that the mesh 48 of the second cathode 42/48 is not in touching contact with the substrate 46 (first cathode) but is connected electrically to the thief plate 42. In some cases the wafer 46, the thief plate 42 and the mesh 48 are all electrically connected to the same terminal of the power supply 60.

The woven mesh 48 is secured to the thief electrode 42 (which can comprise a stainless steel frame) by drilling holes in the electrode 42 and screwing the mesh preferably composed of stainless steel to the electrode 42 (frame). The woven mesh 48 and the thief electrode 42 can be deplated, i.e. cleaned of plated material, in a mixture of KCl and nitric acid.

The size of the woven mesh 48 is chosen based on the size of the microscopic features being plated on the substrate 46 as well as the feature density. For example a 40 mesh (40 wires/inch) is made of wires with a diameter of about 0.25 mm and a spacing of about 0.4 mm. The distance between the substrate 46 and the mesh 48 also depends upon the size and density of the features. Thus, the current reaching a substrate 46, which is a workpiece, is essentially filtered by the mesh 48. This process has been demonstrated on 127 mm substrates where only the interlayer vias/studs were plated successfully. The invention solves the above-mentioned problems of non-uniformity of plating by effectively controlling the current reaching the microscopic features on the substrate 46. The mesh 48 acts as a filter for excess current.

Metals which are commonly plated in the types of applications mentioned above include nickel, copper and gold. In those cases the anode 76 could be composed of a soluble metal such as nickel or copper or an insoluble metal for plating nickel or copper respectively, typically an insoluble anode for plating gold. Alternatively, the anode 76 can be composed of an insoluble metal such as platinum or platinized titanium.

Bath I

A bath for plating copper onto a substrate is an aqueous copper sulphate solution.

| Chemicals | Concentration |
|---|---|
| $CuSO_4$ | 1/4 molar solution |
| $H_2SO_4$ | 10% |
| HCl | 50 ppm–100 ppm |
| Organic additives | |

Bath II

A bath for plating nickel onto a substrate is a chloride free nickel sulfamate bath.

| Chemicals | Concentration |
|---|---|
| Nickel Sulfamate | 300 grams/liter to 400 gram/liter |
| Boric acid | 30 grams/liter |
| Activation agents and wetting agents | |

Bath III

A bath, for plating gold onto a substrate is an aqueous solution of gold cyanide.

| Chemicals | Concentration |
|---|---|
| Gold (metal conc.) | 4 grams/liter to 8 grams/liter |
| NaCitrate or KCitrate or NaPhosphate or KPhosphate | 20 grams/liter to 50 grams/liter Inorganic additives, e.g. Pb |

This invention can apply to a ceramic repair process where electroplating of microscopic, variable areas must be plated uniformly to the desired thickness. The variation in the active area of the substrate can be 2% to 300%. However, the arrangement described in our invention nullifies this variation by having the mesh 48 and thief plate 42 dominate the total surface area of the workpiece 46. Thus, the variation of the plating current in the active area of the workpiece 46 itself becomes insignificant. This invention is also applicable to plating solder onto silicon wafers to create C4 bumps. The C4 bump pattern is not necessarily very uniform on the surface of the wafer and also the effectiveness of the surrounding thief plate (the current practice) decreases as the size of the wafer increases to 300 mm and beyond.

Figure 3:
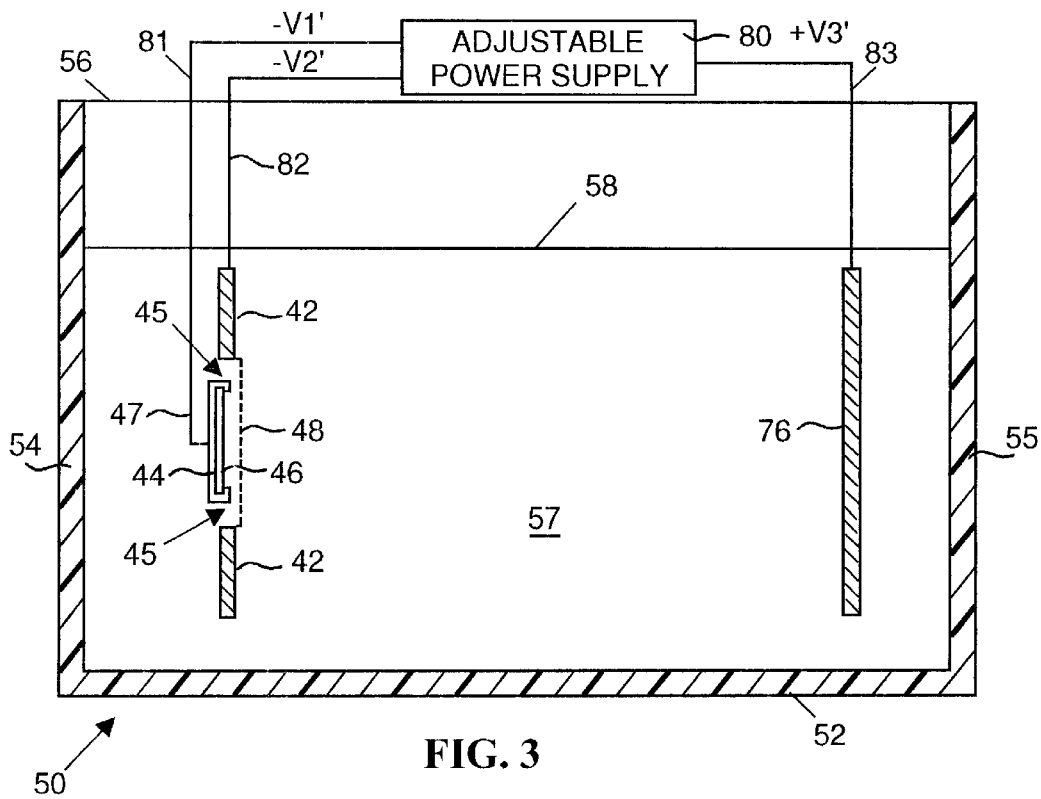
FIG. 3 shows a modification of FIG. 2A in which there is an adjustable power supply with a positive voltage on terminal connected to the anode. There is a negative voltage −V1' connected on line to line to the cathode fixture. A line from the power supply connects voltage −V2' to the thief electrode.

FIG. 3 shows a modification of FIG. 2A in which there is an adjustable power supply 80 with a positive voltage on terminal 83 connected to the anode 76. There is a negative voltage −V1' connected on line 81 to line 47 to the cathode fixture 44. A line 82 from power supply 80 connects voltage −V2' on line 82 to the thief electrode 42. As in the case of FIG. 2A, a pair of reciprocating vertically extending paddles 28 of a VPPC are reciprocated across the surface of the mesh 48 by arms 34A and 34B which move horizontally into and out of the page in accordance with U.S. Pat. No. 5,516,412 of Andricacos et al., the teachings of which are incorporated herein by reference.

Figure 4:
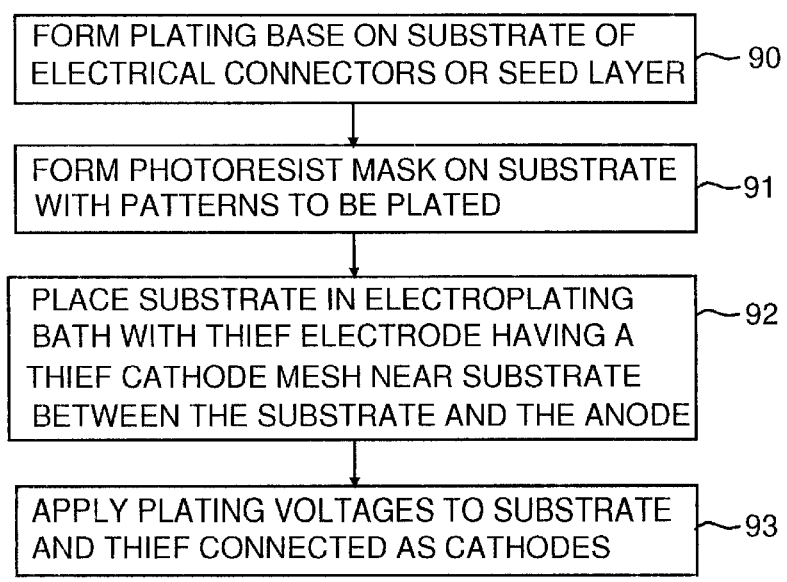
FIG. 4 is a flow chart with steps which show the process flow of the present invention.

FIG. 4 is a flow chart with steps 90–91 which show the process flow of the present invention. In step 90, a plating base is formed on the substrate 46 which will consist of either electrical connectors such as through studs from the back of the substrate 46 or pads on the edge or the border of the substrate 46 or a coating of a seed layer formed on the surface of the substrate 46.

Then in step 91, a photoresist mask is formed on the substrate 46 which provides the pattern which is to be plated onto the exposed surface of the substrate 46.

In step 92, place the substrate 46 which has been coated with the photoresist m (first cathode) 46 ask in an electroplating bath with the thief electrode 42/48 having a thief cathode mesh 48 near the substrate 46 between the substrate 46 and the anode 76. The substrate 46 is placed in or supported by a cathode fixture 44. At the same time a thief electrode 42/48 or the like has been placed around the borders of the substrate 46 or in front of substrate 46 as seen in FIGS. 2A, 3, 5A and 6A, etc. between the substrate 46 and the anode 76.

In step 93, negative voltage is applied to the substrate 46 and the thief electrode 42/46.

FIGS. 5A–5C show a modification of the embodiment of FIG. 2A wherein the mesh 48 has been replaced by a parallel array of wires 48'/48H' which disperse the current to a substantial degree providing easy circulation of ions to all portions of substrate 46. In FIG. 5A, as in the case of FIG. 2A, a pair of reciprocating vertically extending paddles 28 of a VPPC are reciprocated horizontally across the surface of the mesh 48' by arms 34A and 34B in accordance with U.S. Pat. No. 5,516,412 of Andricacos et al., the teachings of which are incorporated herein by reference.

FIGS. 6A–6C show a modification of the embodiment of FIG. 2A wherein the mesh 48 has been replaced by a stainless steel plate 48P which has through holes 48A machined therethrough in the form of a matrix. The dimensions and separation of the holes 48A is a function of the data collected for an empirical approach to optimization of the uniformity of plating. As in the case of FIG. 2A, a pair of reciprocating vertically extending paddles 28 of a VPPC are reciprocated across the surface of the mesh 48P by arms 34A and 34B which move horizontally into and out of the page in accordance with U.S. Pat. No. 5,516,412 of Andricacos et al., the teachings of which are incorporated herein by reference.

SUMMARY

This invention applies to microelectronics applications such as flip-chip interconnections and electroplating these bumps through resist masks.

One can use the same recipe to electroplate substrates with different amounts of active area (change the time proportionately to obtain desired thickness). It is not necessary to have multiple power supplies.

The uniformity of dispersion of the features does not matter. It is unnecessary to have special custom-designed power supplies to control very small currents, and it is unnecessary to optimize the plating parameters for every new substrate design.

One can mix and match different substrates without changing the parameters to avoid misprocessing and operator errors (thus avoiding yield loss). There are no limitations on the size of the substrate. It is possible to achieve good plating uniformity without the use of paddle cell plating apparatus.

Applications of the process include all plating-thru mask plating processes, thin-film repairs performed by plating, ceramic repair processes performed by electroplating, C4 bump plating of wafers (even the chip designs with only peripheral I/O's); and all thin film wiring and interconnect via/stud plating for microelectronic applications.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A process for electroplating metallic features onto a workpiece comprising a substrate having a top side including surfaces to be electroplated comprising the steps as follows:

providing a plating tank with a bottom, side walls, a front wall and a back wall and containing an electroplating bath, providing an anode in the bath connected to a positive voltage, placing a substrate having plating surfaces to be electroplated into the electroplating bath, connecting surfaces to be plated as a first cathode connected to a first negative voltage, providing agitating means for agitating the electrolyte inside the tank, the agitating means including a paddle and suspension means for reciprocating the paddle along a paddle path in the plating bath between the front and back walls parallel to the surfaces to be electroplated in very close proximity thereto, supporting a second cathode including a portion thereof with openings therethrough extending across the surfaces to be electroplated of the substrate and positioned between the plating surfaces and the paddle path, juxtaposing the second cathode with the substrate in close proximity thereto with a narrow space therebetween, and connecting the second cathode to a negative voltage, whereby the portion of the second cathode with openings therethrough maintains the second cathode voltage at a substantially uniform value across the substrate, thereby dominating the electropotential in the bath across the total surface area of the substrate.

2. The process of claim 1 wherein the openings comprise apertures through the second cathode extending across the substrate.

3. The process of claim 1 wherein the openings are formed between parallel wires extending across the substrate.

4. The process of claim 1 wherein the openings comprise a wire mesh extending across the substrate.

5. The process of claim 1 wherein the openings comprise apertures formed in a plate located between the paddle path and the cathode.

6. The process of claim 1 wherein the openings comprise holes formed in a stainless steel plate located between the paddle path and the first cathode.

7. The process of claim 1 wherein the first cathode and the second cathode are connected to an adjustable power supply.

8. The process of claim 1 wherein the first cathode and the second cathode are connected to the same power supply.

9. The process of claim 1 wherein the first cathode and the second cathode are connected to the same power supply with a resistor in series with the second cathode.

10. The process of claim 1 wherein:

the openings comprise apertures through the second cathode extending across the substrate, and the first and second cathodes are connected to the same power supply.

11. The process of claim 1 wherein:
the openings are formed between parallel wires extending across the substrate, and
the first and second cathodes are connected to the same power supply.

12. The process of claim 1 wherein:
the openings comprise a wire mesh extending across the substrate and the first cathode, and
the second cathode are connected to the same power supply.

13. The process of claim 1 wherein:
the openings comprise apertures through the second cathode extending across the substrate, and
the first and second cathodes are connected to an adjustable power supply.

14. The process of claim 1 wherein:
the openings are formed between parallel wires extending across the substrate, and
the first and second cathodes are connected to an adjustable power supply.

15. The process of claim 1 wherein:
the openings comprise a wire mesh extending across the substrate, and
the first and the second cathodes are connected to an adjustable power supply.

16. The process of claim 1 wherein:
the openings comprise apertures through the second cathode extending across the substrate and the first cathode, and
the second cathode are connected to the same power supply with a resistor in series with the second cathode.

17. The process of claim 1 wherein:
the openings are formed between parallel wires extending across the substrate, and
the first and second cathodes are connected to the same power supply with a resistor in series with the second cathode.

18. The process of claim 1 wherein:
the openings comprise a wire mesh extending across the substrate, and
the first and second cathodes are connected to the same power supply with a resistor in series with the second cathode.

19. A process for electroplating metal features onto a substrate having a top side including a plating surface comprising:
providing a plating tank with a bottom, side walls, a front wall and a back wall and containing an electroplating bath with an anode at a positive voltage,
placing a substrate to be electroplated into the electroplating bath,
connecting surfaces to be plated to a first cathode which is at a first negative voltage,
providing agitating means for agitating the electrolyte inside the tank, the agitating means including a paddle and suspension means for reciprocating the paddle in the plating bath along a paddle path between the front and back walls and parallel to the surfaces to be plated in very close proximity thereto with the paddle path being spaced on the order of 4 mm from the substrate,
supporting a second cathode including a partially open screening electrode at a second negative voltage, the screening electrode being located in close proximity to the first cathode and to the substrate in juxtaposition therewith between the substrate and the paddle path, the structure of the screening electrode being selected from the group consisting of a plating mesh, an aperture plate, and an array of parallel wires, whereby the portion of the second cathode with the partially open screening electrode maintains the second cathode voltage at a substantially uniform value across the substrate, thereby dominating the electropotential in the bath across the total surface area of the substrate.

20. The process of claim 19 wherein:
the openings comprise a wire mesh extending across the substrate, and
the first and second cathodes are connected to power supplied in a manner selected from the group consisting of as follows:
connecting the second cathode in series with a resistor to the power supply, and
connecting the first and second cathodes with a resistor in series with the second cathode to the power supply which is adjustable.

21. Apparatus for electroplating metal features onto a workpiece comprising a substrate having a top side including a plating surface comprising:
a plating tank with an electroplating bath and an anode in the bath, with the anode being connected to a positive voltage,
means for placing a substrate having plating surfaces to be electroplated in the electroplating bath,
means for connecting the substrate to a first cathode, with the first cathode being connected to a first negative voltage,
agitating means for agitating the electroplating bath inside the tank, the agitating means including a paddle and suspension means for reciprocating the paddle along a paddle path parallel to the plating surfaces in the plating bath,
a second cathode connected to means for supplying a second negative voltage located between the plating surfaces and the paddle path, and
a portion of the second cathode having openings therethrough extending across the plating surfaces of the substrate and the openings therethrough being positioned between the substrate and the anode with the second cathode being in close proximity to the substrate and juxtaposed therewith.

22. The apparatus of claim 21 wherein the openings comprise apertures through the second cathode extending across the substrate.

23. The apparatus of claim 21 wherein the openings are formed between parallel wires extending across the substrate.

24. The apparatus of claim 21 wherein the openings comprise a wire mesh extending across the substrate.

25. The apparatus of claim 21 wherein the openings comprise apertures formed in a plate located between the paddle path and the cathode.

26. The apparatus of claim 21 wherein the openings comprise holes formed in a stainless steel plate located between the paddle path and the first cathode.

27. The apparatus of claim 21 wherein the first and second cathodes are connected to an adjustable power supply.

28. The apparatus of claim 21 wherein the first and second cathodes are connected to the same power supply.

29. The apparatus of claim 21 wherein the first and second cathodes are connected to the same power supply with a resistor in series with the second cathode.

30. The apparatus of claim 21 wherein:
the openings comprise apertures through the second cathode extending across the substrate, and
the means for providing cathodes are connected to the same power supply.

31. The apparatus of claim 21 wherein:
the openings are formed between parallel wires extending across the substrate, and
the first and second cathodes are connected to the same power supply.

32. The apparatus of claim 21 wherein:
the openings comprise a wire mesh extending across the substrate, and the first and
second cathodes are connected to the same power supply.

33. The apparatus of claim 21 wherein:
the openings comprise apertures through the second cathode extending across the substrate, and
the first and second cathodes are connected to an adjustable power supply.

34. The apparatus of claim 21 wherein:
the openings are formed between parallel wires extending across the substrate, and
the first and second cathodes are connected to an adjustable power supply.

35. The apparatus of claim 21 wherein:
the openings comprise a wire mesh extending across the substrate, and
the first cathode and second cathode are connected to an adjustable power supply.

36. The apparatus of claim 21 wherein:
the openings comprise apertures through the second cathode extending across the substrate, and
the first and second cathodes are connected to the same power supply with a resistor in series with the second cathode.

37. The apparatus of claim 21 wherein:
the openings are formed between parallel wires extending across the substrate, and
the first and second cathodes are connected to the same power supply with a resistor in series with the second cathode.

38. The apparatus of claim 21 wherein:
the openings comprise a wire mesh extending across the substrate, and
the first and second cathodes are connected to the same power supply with a resistor in series with the second cathode.

39. Apparatus for electroplating metal features onto a substrate having a top side including a plating surface comprising:
a plating tank with a bottom, side walls, a front wall and a back wall for containing an electroplating bath,
an anode in the bath connected to a positive voltage,
means for placing a substrate to be electroplated into the electroplating bath,
means for connecting surfaces to be plated to a first cathode which is connected to a first negative voltage,
agitating means for agitating the electroplating bath inside the tank, the agitating means including a paddle and suspension means for reciprocating the paddle in the plating bath between the front and back walls along a paddle path parallel to the surfaces to be plated in very close proximity thereto,
means for supporting a second cathode juxtaposed with the substrate, with the second cathode being positioned between the substrate and the paddle path, and with the second cathode including a partially open screening electrode selected from a plating mesh and aperture plate and parallel wires proximate to the substrate, and
means for connecting the second cathode to a second negative voltage.

40. The apparatus of claim 39 wherein:
the openings comprise a wire mesh extending across the substrate, and the first and second cathodes are connected in a manner selected from the group consisting of as follows:
the second cathode is connected in series with a resistor to a power supply,
the first and second cathodes are connected to a single power supply,
the first and second cathodes are connected to a single power supply, which is adjustable, with a resistor in series with the second cathode.

41. A plating apparatus, comprising:
an electroplating tank with front and back walls
an anode connected to a positive voltage located in the tank,
a thief electrode located in the tank,
means for connecting a workpiece as a first cathodes
means for locating the workpiece behind the plane of the thief electrode and on the opposite side of the plane of the thief electrode from the anode in the tank,
agitating means for agitating the electrolyte inside the tank, the agitating means including a paddle and suspension means for reciprocating the paddle along a paddle path in the plating bath between the front and back walls parallel to the surfaces to be plated, the paddle path being spaced on the order of 4 mm from the workpiece,
the thief electrode including a mesh type portion connected as a second cathode above and adjacent to the workpiece with the mesh type portion being in close proximity to the workpiece and in juxtaposition therewith located between the workpiece and the paddle path, and
the workpiece and the thief electrode including the mesh type portion being connected to at least one power supply means for supplying negative voltages.

* * * * *